United States Patent [19]
Rishi

[11] Patent Number: 6,127,884
[45] Date of Patent: Oct. 3, 2000

[54] DIFFERENTIATE AND MULTIPLY BASED TIMING RECOVERY IN A QUADRATURE DEMODULATOR

[75] Inventor: Mohindra Rishi, Milpitas, Calif.

[73] Assignee: Philips Electronics North America Corp., New York, N.Y.

[21] Appl. No.: 09/316,556

[22] Filed: May 24, 1999

[51] Int. Cl.[7] .......................... H03D 3/00; H04L 27/227; H04L 27/38
[52] U.S. Cl. .......................... 329/304; 329/306; 329/307; 375/261; 375/325; 375/329; 375/344
[58] Field of Search .................................... 329/304–310; 375/261, 325, 329–333, 340, 344, 345, 355, 371, 373–376

[56] References Cited

U.S. PATENT DOCUMENTS

| | | | |
|---|---|---|---|
| 3,590,386 | 6/1971 | Tisi et al. | 325/321 |
| 4,766,392 | 8/1988 | Moore | 329/124 |
| 5,079,513 | 1/1992 | Noguchi et al. | 329/304 |

OTHER PUBLICATIONS

By L. E. Larson, "RF and Microwave Circuit Design for Wireless Communications", Artech House, Inc., 1996, pp. 193–203.

*Primary Examiner*—David Mis

[57] ABSTRACT

A differentiate and multiply based timing recovery in a quadrature demodulator. A quadrature-modulated signal is received and demodulated by quadrature mixing the received modulated signal with a local oscillator signal. In-phase and quadrature down-converted signals are sampled. The sampled signals are differentially detected to produce binary digits from symbols conveyed by the quadrature-modulated signal. Sampling is controlled by a symbol timing recovery signal derived from the in-phase and quadrature down-converted signal. Thereto, the respective in-phase and quadrature down-converted signals are differentiated with respect to time, the respective differentiated signals are multiplied by the quadrature and in-phase signals, respectively, and the multiplied signals are subtracted from each other so as to produce a difference signal. The difference signal controls the symbol timing recovery in that a clock signal controlling the timing of the sampling is locked to the difference signal.

11 Claims, 3 Drawing Sheets

DIFFERENTIATE AND MULTIPLY BASED TIMING RECOVERY IN A QUADRATURE DEMODULATOR

BACKGROUND OF THE INVENTION

1. Field of the Invention

The present invention relates to symbol timing recovery in a method of demodulating a quadrature modulated signal, generally a quadrature amplitude modulated signal, and particularly a Quadriphase or Quadrature Phase Shift Keying signal (QPSK), Offset-QPSK signal, or Differential-QPSK signal. The demodulation method demodulator still more particularly relates to a π/4-DQPSK signal such as used in IS-136 mobile radio systems and PWT cordless phones as standardized by the TIA/EIA. Such π/4-DQPSK signals, besides phase modulation, typically exhibit relatively large amplitude variations, i.e., are non-constant envelope signals. The present invention further relates to a demodulator, a receiver, and a transceiver for such quadrature modulated signals. In principle, the demodulator is suitable for demodulating zero-IF or low-IF down-converted quadrature signals.

2. Description of the Related Art

In the U.S. Pat. No. 4,766,392, a quadrature demodulator is disclosed for angle modulated signals, for use in a zero-IF receiver, i.e., a receiver in which a received angle modulated signal is supplied to a quadrature mixer for down-converting the received angle modulated signal to base band quadrature signals, an in-phase signal and a quadrature signal, with a zero intermediate frequency. The demodulator is of a so-called DAM-type, Differentiate and Multiply, in which, in the data demodulation path differentiate and multiply means are provided which are comprised of a pair of differentiators and multipliers in the data path, outputs of the differentiators being coupled to inputs of the multipliers, and inputs of the differentiators being cross-coupled to further inputs of the multipliers. For obtaining an 'ideal' FM demodulator, envelope determining means of the in-phase and quadrature signals are provided, the envelope determining means controlling a gain of a variable gain amplifier in the data path, the variable gain amplifier being coupled between a subtractor for subtracting output signals of the multipliers from each other, and a low pass filter at an output of which a demodulated signal is present. The envelope determining means, together with the variable gain amplifier, form a fast AGC (Automatic Gain Control) means. Were not the fast AGC means present, then the demodulator would not be suitable for demodulating modulated π/4-DQPSK signals, these signals being non-constant amplitude signals. Then, the demodulator would not properly work as an FM-demodulator because amplitude fluctuations in the received radio frequency angle modulated signal cause a distorted complex signal, following quadrature mixing. A fast AGC is not desirable, however, a fast AGC requiring a higher bandwidth and higher power consumption. Particularly in portable devices, high power consumption is undesirable. For π/4-DQPSK signal, at zero-IF, the differentiators should be high pass filters, such as RC-filters, with a high 3-dB cutoff frequency, e.g., 10–20 MHz, i.e., high bandwidth filters. The diffentiators should operate in a highly linear range, such not being the case is the distance between the frequency operating range of the differentiators and their 3-dB cutoff frequency is small. Was this the case, the resulting BER (Bit Error Rate) of the demodulator would be very poor.

Other known demodulators for quadrature modulated signals, such as frequency or phase modulated signals, comprise differential detection means instead of demodulation being performed by an 'ideal' demodulator such as disclosed in the above U.S. Pat. No. 4,766,392. Without special measures, such demodulators with differential detection means are not very suitable for demodulating π/4-DQPSK signals or other non-constant envelope quadrature modulated signals because of a then non-optimal symbol timing recovery.

π/4-DQPSK (de-)modulation as such is described in the handbook "RF and Microwave Circuit Design for Wireless Communications", L. E. Larson, Artech House, Inc., 1996, pp. 193–204.

Furthermore, digital phase lock loop circuits (DPLL) as such are well known, such circuits being particularly suitable as a symbol timing recovery means in a quadrature demodulator.

SUMMARY OF THE INVENTION

It is an object of the invention to provide a demodulation method, for demodulating a quadrature-modulated signal, of a differentially detecting type with an optimal symbol timing recovery.

It is another object of the invention to provide a demodulation method operating with an automatic gain control which is slow with respect to a symbol rate of the quadrature modulated signal.

It is still another object of the invention to provide a demodulation method with a simple but efficient symbol-locking means.

In accordance with the invention, a method of demodulating a quadrature-modulated signal is provided comprising:

quadrature mixing said quadrature modulated signal with a local oscillator signal to produce an in-phase signal and a quadrature signal, said in-phase and quadrature signals being down-converted base band versions of said quadrature modulated signal;

sampling said in-phase and quadrature signals to produce respective in-phase signal samples and quadrature signal samples, said sampling being controlled by a symbol timing recovery signal produced from said in-phase and quadrature signals by locking to a symbol rate of symbols conveyed in said quadrature modulated signal;

differentially detecting said in-phase and quadrature signal samples to produce binary digits from said symbols;

differentiating with respect to time of said in-phase and quadrature signals to produce a first and a second differentiated signal, respectively;

multiplying said first differentiated signal by said quadrature signal to produce a first auxiliary signal, and multiplying said second differentiated signal by said in-phase signal to produce a second auxiliary signal; and forming a difference signal by subtracting said first and second auxiliary signals from each other, said difference signal controlling said locking.

The invention is based upon the insight that, when using differential detection, an advantage could be taken from strong envelope variations in the complex down-converted signal. It was realized that such strong variations would help, rather than cause detrimental effects, when being used in the symbol timing recovery path. It was realized that such strong amplitude variations would equalize large amplitude peaks in the signal to be supplied to the symbol timing recovery means, i.e. amplitude fluctuations have an equalizing effect on said difference signal.

It further was realized that a slow AGC, although not absolutely necessary, would only achieve some peaking of the signal to be supplied to the symbol timing recovery means. In principle, some AGC could only be needed or desirable for keeping signals in the data path within their dynamic range of filters provided in the data path.

Preferably, the symbol timing recovery means are implemented as a digital phase locked loop circuit.

DESCRIPTION OF THE PREFERRED EMBODIMENT

Figure 1:
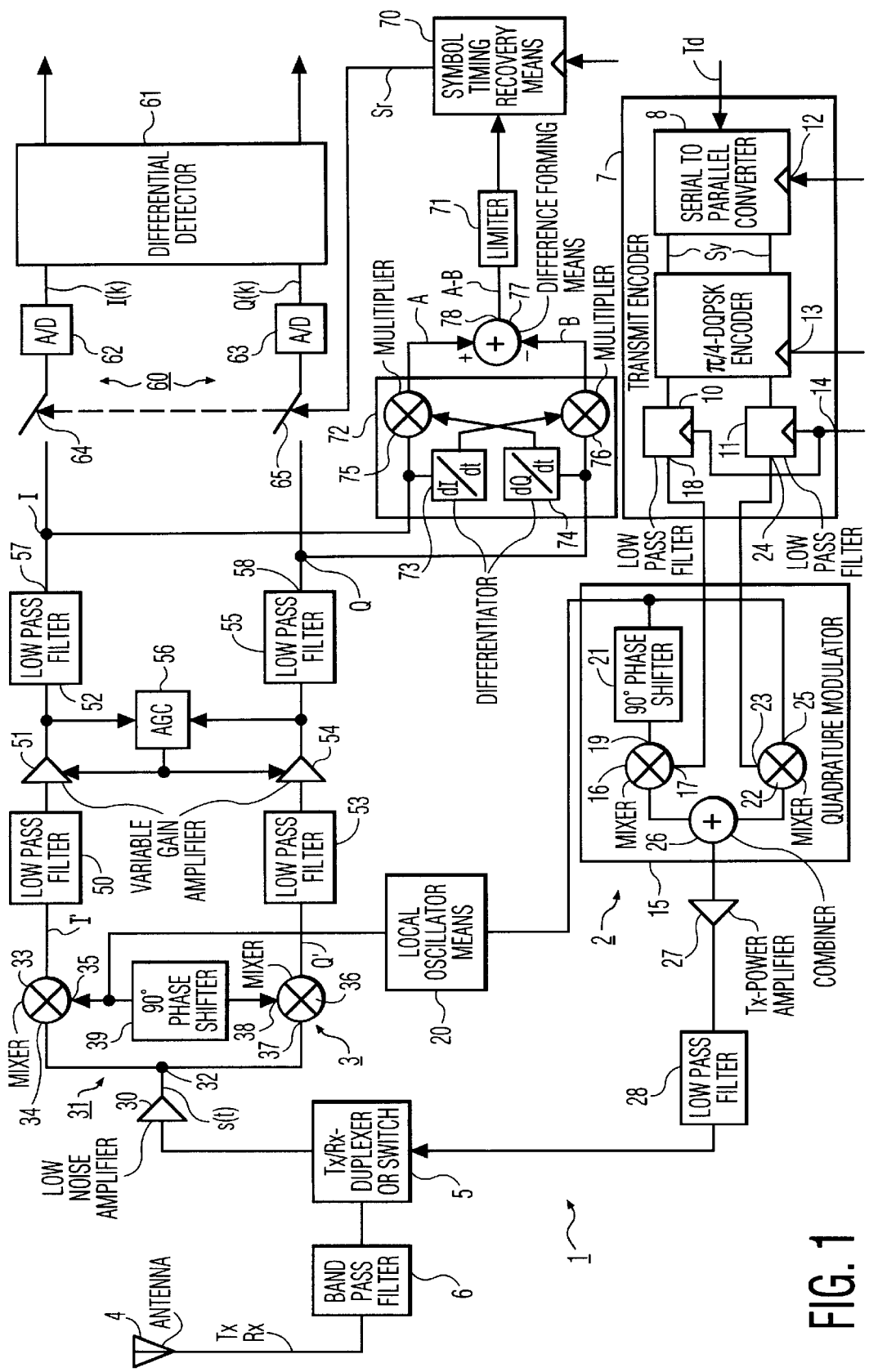
FIG. 1 schematically shows a block diagram of a transceiver according to the present invention.

FIG. 1 schematically shows a block diagram of a transceiver 1 according to the present invention. The transceiver 1 comprises a transmitter 2 and a receiver 3, the transmitter 2 and the receiver 3 being coupled to an antenna 4 via a Tx/Rx-duplexer or switch 5 and a band pass filter 6, and the antenna 4 transmitting and receiving quadrature modulated radio frequency signals Tx and Rx. In case of a receiver-only functionality, the transmitter 2 and the Tx/Rx-duplexer or switch are dispensed with.

Figure 2:
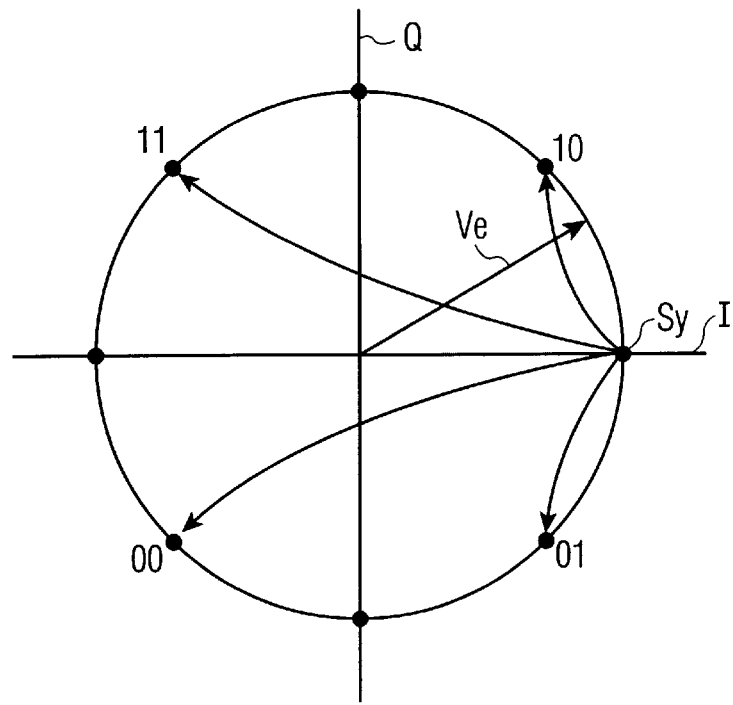
FIG. 2 is a phase domain illustration of π/4-DQPSK demodulation.

The transmitter 2 comprises a transmit encoder 7 for encoding base band digital transmit data Td. The transmit encoder 7 comprises a serial-to-parallel converter 8 for generating two bit symbols Sy from the transmit data Td, a π/4-DQPSK encoder 9, and low pass filters 10 and 11. The serial-to-parallel converter 8, the π/4-DQPSK encoder 9, and the filters 9 and 10, have a transmit bit clock input 12, a transmit symbol clock input 13, and a reference clock input 14, respectively. The transmit encoder 7 is coupled to a quadrature modulator 15. The quadrature modulator 15 comprises a first mixer 16 of which a first input 17 is coupled to an output 18 of the filter 10, and of which a second input 19 is coupled to local oscillator means 20 via a ninety degrees phase shifter 21, and a second mixer 22 of which a first input 23 is coupled to an output 24 of the filter 11, and of which a second input 25 is coupled to the local oscillator means 20. The quadrature modulator 15 further comprises a combiner 26 for combining output signals of the mixers 16 and 22. The quadrature modulator 15 is coupled to the Tx/Rx-duplexer 5 via a transmit power amplifier 27 and a low pass filter 28. The π/4-DQPSK transmit encoder 7 generates a differentially encoded phase shift keying signal. The incoming bit stream Td is separated into groups of two-bit symbols Sy. Successive symbols Sy are part of two π/4 rotated QPSK constellations with each symbol lying on either the I or Q axis, or on axes rotated over π/4 with respect to the I or Q axis. In π/4-DQPSK, symbols are represented by one of eight equally spaced phase angles, whereby only selected phase angles are available for the next symbol, depending on the phase angle of the present symbol, as shown in FIG. 2 which is a phase domain illustration of π/4-DQPSK demodulation. If the present symbol Sy corresponds to zero degrees, the only allowable symbols for the next symbol are on the axis rotated over π/4 with respect to the I and Q axes, as illustrated with the arrows originating from the present symbol Sy. This means that the phase of the symbol succeeding the present symbol Sy can be 45, 135, −45, or −135 degrees. Adding a differential phase angle to the present symbol's phase derives a next symbol phase angle, differential phase angles being transmitted. As shown, differential phase angles are mapped as a function of two bits in the transmit bit stream Td for the next symbol. Given a phase angle of zero degrees for the present symbol Sy, a phase angle of −135 will be added to a next set of bits "00", and phase angles of −45 degrees, 45 degrees, and 135 degrees will be added to a next set of bits "01", "10", and "11", respectively. Because even for long strings of 0s or 1s phase transitions always occur in the transmitted signal, symbol timing recovery in the receiver is easier than with other forms of phase modulation. Further shown in FIG. 2 is a reception vector Ve of a π/4-DQPSK received signal Rx as received by the receiver 3 from another transceiver.

The receiver 3 comprises a low noise amplifier 30, which is coupled to the Tx/Rx-duplexer or switch 5. The amplifier 30 is coupled to a quadrature demodulator 31 with an input 32 for receiving a filtered and amplified quadrature modulated signal s(t). The demodulator 31 comprises quadrature mixing means comprised of a mixer 33 of which a first input 34 is coupled to the input 32 and of which a second input 35 is coupled to the local oscillator means 20, and of a mixer 36 of which a first input 37 is coupled to the input 32 and of which a second input 38 is coupled to the local oscillator means via a ninety degrees phase shifter 39. The mixer 33 produces an in-phase signal I', and the mixer 36 produces a quadrature signal Q', the in-phase and quadrature signals I' and Q' being down-converted base band versions of the quadrature modulated signal s(t), either at zero-IF or at low-IF. In the in-phase branch, the receiver 3 further comprises a succession of a low pass filter 50, a variable gain amplifier 51, and a low pass filter 52, and in the quadrature branch, the receiver 3 further comprises a succession of a low pass filter 53, a variable gain amplifier 54, and a low pass filter 55. The receiver 3 further comprises an automatic gain control means 56 for measuring levels of respective output signals produced by the variable gain amplifiers 51 and 54, the measured levels controlling the gain of the variable gain amplifiers 51 and 54. From a demodulation point of view, in the receiver 3 according to the present invention, in principle automatic gain control can be dispensed with. When present, automatic gain control is slow as compared to the symbol rate of the symbol Sy. Automatic gain control somewhat peaks a signal to be provided for symbol timing recovery, but such a signal is still quite suitable to control timing recovery. Basically, in the receiver 3 according to the present invention, automatic gain control is applied to keep signals within the dynamic ranges of the filters 50, 52, 53, and 55. At outputs 57 and 58 of the filters 52 and 55, filtered versions I and Q of the signals I' and Q' are present, respectively.

Figure 3:
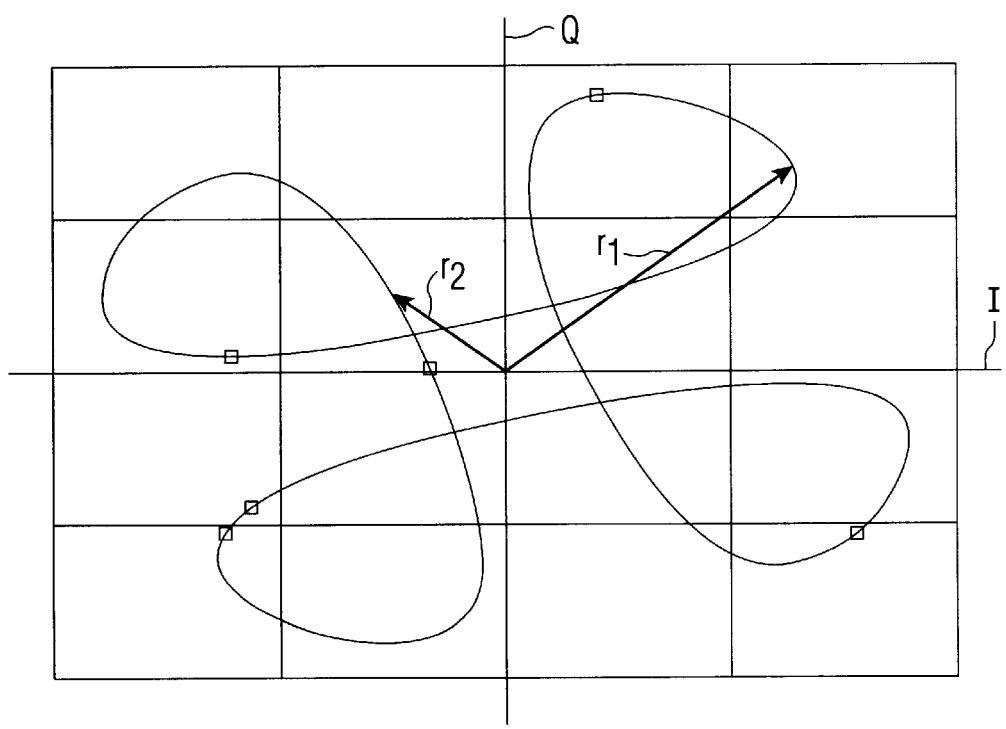
FIG. 3 illustrates amplitude variations in a π/4-DQPSK demodulator according to the present invention.

The receiver 3 further comprises sampling means 60 for sampling the in-phase and quadrature signals I and Q so as to produce respective in-phase signal and quadrature samples I(k) and Q(k), and a differential detector 61 coupled to the sampling means 60. The sampling means 60 comprises respective analog-to digital converter 63, and sampling control means 64 and 65 controlling sampling at a rate of t=kT, t being time, k being an integer value, and T being a sampling period. The differential detector 61 provides two bits $x_k$ and $y_k$ per differentially detected received symbol Sy in the received quadrature modulated signal Rx, according to the differential equations:

$$x_k = -\text{sign}\,[Q(k)I(k-1) - I(k)Q(k-1)], \text{ and}$$

$$y_k = -\text{sign}\,[I(k)I(k-1)+Q(k)Q(k-1)],$$

sign being the well-known signum function, sign(x)=1 if x>0, sign(x)=0 if x=0, and sign(x)=−1 if x<0, x being the argument of the signum function. Differential detection is independent of envelope distortions in the received complex signal s(t). Such amplitude distortions or amplitude variations, as shown in FIG. 3, occur in a π/4-DQPSK demodulator according to the present invention because of the nature of the π/4-DQPSK signal, and because of the fact that neither fast AGC is applied to equalize such distortions, nor an 'ideal' FM demodulator is applied such as described in said US patent U.S. Pat. No. 4,766,392. Had in U.S. Pat. No. 4,766,392 slow AGC been applied, so that the FM-demodulator is no longer ideal, then the signal [I.(dQ/dt)−Q.(dI/dt)] at the outputs of the mixers 22 and 25 in U.S. Pat. No. 4,766,392 would exhibit strong amplitude fluctuations and would no longer be useful for detecting π/4-DQPSK signals. The present invention applies differential detection instead and uses an equalized signal for symbol timing recovery.

The receiver 3 further comprises a symbol timing recovery means 70, coupled to the quadrature mixing means 31 via a limiter 71, for generating a symbol timing recovery signal sr from the in-phase and quadrature signals I and Q, upon receiving of a preamble signal (not shown) preceding receive data (not shown). The symbol timing means 70 can be a digital phased lock loop circuit, well known in the art. The symbol timing recovery signal sr determines the sampling instant t=kT of the sampling means 60. Sampling should be done at an instant of optimal eye opening in an eye-diagram of received symbols, such eye-diagrams being well known in the art.

According to the present invention, an equalized signal for timing recovery is obtained by means of a differentiating and multiplying means 72 for differentiating with respect to time of the in-phase and quadrature signals I and Q so as to produce a first and a second differentiated signal dI/dt and dQ/dt, by respective differentiators 73 and 74, and for multiplying the signal dI/dt by the signal Q, and the signal dQ/dt by the signal I, with respective multipliers 75 and 76, to produce respective auxiliary signals A and B, respectively. A difference signal A−B is formed from the signals A and B by a difference forming means 77. The signal A−B substantially differs from an output signal of an ideal FM demodulator and is very well suitable as a signal for controlling the symbol timing recovery means 70, because scaling of a differentiated phase signal does not effect polarity and zero crossings of the differentiated phase signal which is further subjected to limiting. Slow AGC somewhat peaks the difference signal A−B.

Figure 4:
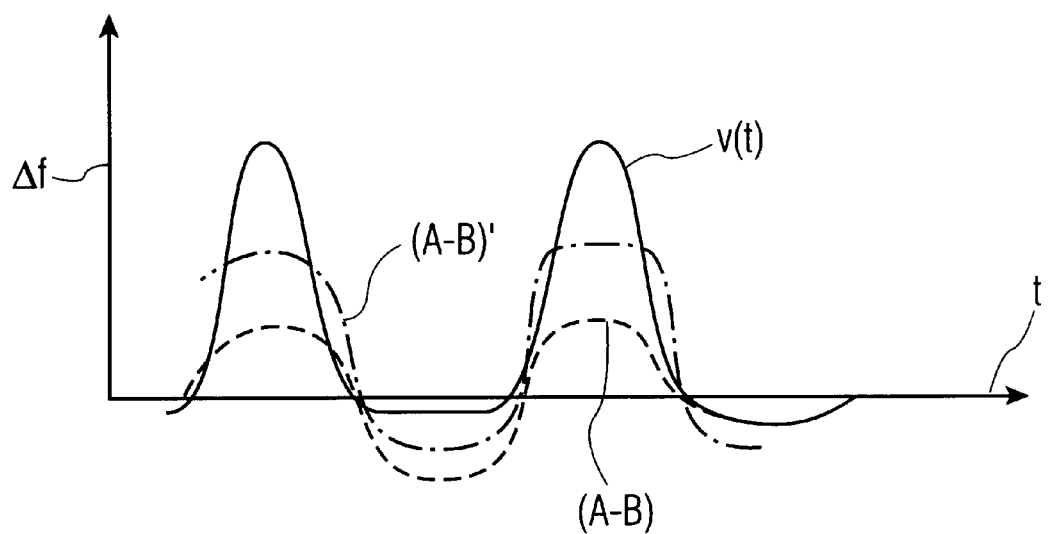
FIG. 4 shows an intermediate signal and an equalized intermediate signal in a demodulator according to the present invention.

FIG. 4 shows a signal v(t) that would appear at the outputs 57 and 58 had very fast AGC been applied, i.e., is a signal of an ideal FM-demodulator, and shows, at the output 78 of the difference forming means 77, an intermediate signal A−B, without AGC, or a slightly peaked intermediate signal (A−B)', had slow AGC been applied, in the demodulator 31 according to the present invention, the signals v(t), (A−B), and (A−B)' being average frequency changes Δf over a symbol period T, t being time, Δf=Δφ/Δt, Δφ being the phase change over a symbol period. The signal A−B is a scaled version of an ideal FM demodulator output, scaled by $r^2$, r being the carrier envelope of the received signal:

$$(A-B) = I.dQ/dt - Q.dI/dt = r^2.d\phi/dt.$$

As can be seen in FIG. 3, the magnitude of the envelope of the received signal $r_1$, around a π/4 phase change in a symbol period, is much larger than the magnitude of the envelope of the received signal $r_2$, around a 3π/4 phase change in a symbol period, i.e., the differentiating and multiplying means 72 has a much higher gain for +/−π/4 phase changes than for +/−3π/4 phase changes. This variation in gain has an equalizing effect on the signal v(t), i.e., scaling by $r^2$ achieves that frequency spikes in the signal v(t), which occur for very small values of r, are removed. Applying slow AGC still equalizes the signal v(t), as shown by the signal (A−B)' in FIG. 4. Since the frequency spikes as normally appearing in an ideal FM demodulator output have been removed by the differentiating and multiplying means (DAM) 72 in the symbol timing recovery path, the differentiators 73 and 74, which are implemented as first order high pass filters, for instance, can have a much smaller cut-off frequency than a DAM in the data path of an ideal FM demodulator, without having a detrimental effect on the bit error rate.

The differentiating and multiplying means 72 can be implemented digitally. In that case, two further analog-to-digital converters are provided (not shown) for sampling the signals I and Q, to produce samples for the then digital DAM 72. Implementation of a digital DAM 72 is straightforwardly implementing the above equation for (A−B) by means of a programmed signal processor, or the like. Furthermore, the base band demodulator part, i.e. the part following the mixers 33 and 36, can be implemented digitally by means of such a programmed signal processor. In that case, the filters 50, 52, 53, and 55, the amplifiers 51 and 54, the AGC means 56, the DAM 72, the limiter 71, and the difference forming means 77 are programmed computer means, it being well-known in the art how to implement digital low pass and high pass filters, subtractors, and amplifiers as such. When implemented digitally, the DAM 72 only needs a low sampling rate, e.g. four samples per second, to obtain a proper symbol timing recovery.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A method of demodulating a quadrature modulated signal, said method comprising:

quadrature mixing said quadrature modulated signal with a local oscillator signal to produce an in-phase signal and a quadrature signal, said in-phase and quadrature signals being down-converted base band versions of said quadrature modulated signal;

sampling said in-phase and quadrature signals to produce respective in-phase signal samples and quadrature signal samples, said sampling being controlled by a symbol timing recovery signal produced from said in-phase and quadrature signals by locking to a symbol rate of symbols conveyed in said quadrature modulated signal;

differentially detecting said in-phase and quadrature signal samples to produce binary digits from said symbols;

differentiating with respect to time of said in-phase and quadrature signals to produce a first and a second differentiated signal, respectively;

multiplying said first differentiated signal by said quadrature signal to produce a first auxiliary signal, and multiplying said second differentiated signal by said in-phase signal to produce a second auxiliary signal; and forming a difference signal by subtracting said first and second auxiliary signals from each other, said difference signal controlling said locking.

2. A method as claimed in claim 1, wherein said in-phase and quadrature signals are subjected to variable gain amplification, respectively, before being subjected to said sampling and said differentiating, and levels of respective output signals produced by said variable gain amplifications are measured, said measured levels determining a gain control signal for controlling said variable gain amplification.

3. A method as claimed in claim 2, wherein said controlling of said variable gain amplification operates slowly as compared to said symbol rate.

4. A method as claimed in claim 1, wherein said locking is performed by phase locking a phase of a reference clock signal to a phase of said difference signal, a phase locked version of said reference clock signal being said symbol timing recovery signal.

5. A method as claimed in claim 1, wherein said difference signal is subjected to limiting, prior to controlling said locking.

6. A demodulator for a quadrature modulated signal, said demodulator comprising:
an input for said quadrature modulated signal;
a local oscillator means;
quadrature mixing means to inputs of which said input and said local oscillator means are coupled, for producing an in-phase signal and a quadrature signal, said in-phase and quadrature signals being down-converted base band or low frequency versions of said quadrature modulated signal;
symbol timing recovery means coupled to said quadrature mixing means, for generating a symbol timing recovery signal from said in-phase and quadrature signals by locking to a symbol rate of symbols conveyed in said quadrature modulated signal;
sampling means coupled to said quadrature mixing means, for sampling said in-phase and quadrature signals so as to produce respective in-phase signal samples and quadrature signal samples, said sampling means being controlled by said symbol timing recovery signal;
differentially detecting means for differentially detecting said symbols from said in-phase and quadrature signal samples and for generating binary digits from said detected symbols;
differentiating and multiplying means for differentiating with respect to time of said in-phase and quadrature signals so as to produce a first and a second differentiated signal, respectively, and for multiplying said first differentiated signal by said quadrature signal to produce a first auxiliary signal, and multiplying said second differentiated signal by said in-phase signal to produce a second auxiliary signal; and
means for forming a difference signal by subtracting said first and second auxiliary signals from each other, said difference signal controlling said symbol timing recovery means.

7. A demodulator as claimed in claim 6, comprising a first variable gain amplifier for amplifying said in-phase signal and a second variable gain amplifier for said quadrature signal, said first and second amplifiers having respective gain control inputs and being coupled between said mixing means and said sampling means, and level measuring means for measuring levels of respective output signals of said variable gain amplifiers, said measured levels determining a gain control signal provided to said gain control inputs, for controlling said variable gain amplification.

8. A demodulator as claimed in claim 6, wherein said timing symbol recovery means are formed by a digital phase locked loop circuit, locking being performed by phase locking a phase of a reference clock signal to a phase of said difference signal, a phase locked version of said reference clock signal being said symbol timing recovery signal.

9. A demodulator as claimed in claim 6, comprising limiting means coupled between said differentiating and multiplying means and said symbol timing recovery means.

10. A receiver comprising a receiver front end and an antenna coupled to said receiver front end, said antenna receiving a quadrature modulated signal, and comprising a demodulator for demodulating said quadrature modulated signal, said demodulator comprising:
an input for said quadrature modulated signal;
a local oscillator means;
quadrature mixing means to inputs of which said input and said local oscillator means are coupled, for producing an in-phase signal and a quadrature signal, said in-phase and quadrature signals being down-converted base band versions of said quadrature modulated signal;
symbol timing recovery means coupled to said quadrature mixing means, for generating a symbol timing recovery signal from said in-phase and quadrature signals by locking to a symbol rate of symbols conveyed in said quadrature modulated signal;
sampling means coupled to said quadrature mixing means, for sampling said in-phase and quadrature signals so as to produce respective in-phase signal samples and quadrature signal samples, said sampling means being controlled by said symbol timing recovery signal;
differentially detecting means for differentially detecting said symbols from said in-phase and quadrature signal samples and for generating binary digits from said detected symbols;
differentiating and multiplying means for differentiating with respect to time of said in-phase and quadrature signals so as to produce a first and a second differentiated signal, respectively, and for multiplying said first differentiated signal by said quadrature signal to produce a first auxiliary signal, and multiplying said second differentiated signal by said in-phase signal to produce a second auxiliary signal; and
means for forming a difference signal by subtracting said first and second auxiliary signals from each other, said difference signal controlling said symbol timing recovery means.

11. A transceiver comprising a transmitter, and a receiver having a receiver front end and an antenna coupled to said receiver front end, said antenna receiving a quadrature modulated signal, and comprising a demodulator for demodulating said quadrature modulated signal, said demodulator comprising:
an input for said quadrature modulated signal;
a local oscillator means;
quadrature mixing means to inputs of which said input and said local oscillator means are coupled, for producing an in-phase signal and a quadrature signal, said in-phase and quadrature signals being down-converted base band versions of said quadrature modulated signal;

symbol timing recovery means coupled to said quadrature mixing means, for generating a symbol timing recovery signal from said in-phase and quadrature signals by locking to a symbol rate of symbols conveyed in said quadrature modulated signal;

sampling means coupled to said quadrature mixing means, for sampling said in-phase and quadrature signals so as to produce respective in-phase signal samples and quadrature signal samples, said sampling means being controlled by said symbol timing recovery signal;

differentially detecting means for differentially detecting said symbols from said in-phase and quadrature signal samples and for generating binary digits from said detected symbols;

differentiating and multiplying means for differentiating with respect to time of said in-phase and quadrature signals so as to produce a first and a second differentiated signal, respectively, and for multiplying said first differentiated signal by said quadrature signal to produce a first auxiliary signal, and multiplying said second differentiated signal by said in-phase signal to produce a second auxiliary signal; and means for forming a difference signal by subtracting said first and second auxiliary signals from each other, said difference signal controlling said symbol timing recovery means.

* * * * *